United States Patent
Shi (10) Patent No.: US 9,997,635 B2
(45) Date of Patent: Jun. 12, 2018

(54) THIN FILM TRANSISTOR, MANUFACTURING METHOD AND TESTING METHOD THEREOF, ARRAY SUBSTRATE AND DISPLAY DEVICE

(71) Applicant: BOE Technology Group Co., Ltd., Beijing (CN)

(72) Inventor: Lei Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 15/537,783

(22) PCT Filed: Nov. 8, 2016

(86) PCT No.: PCT/CN2016/104967
§ 371 (c)(1),
(2) Date: Jun. 19, 2017

(87) PCT Pub. No.: WO2017/118203
PCT Pub. Date: Jul. 13, 2017

(65) Prior Publication Data
US 2018/0061994 A1    Mar. 1, 2018

(30) Foreign Application Priority Data

Jan. 8, 2016  (CN) .......................... 2016 1 0011702

(51) Int. Cl.
*H01L 21/02* (2006.01)
*H01L 29/786* (2006.01)
(Continued)

(52) U.S. Cl.
CPC ........ *H01L 29/78651* (2013.01); *G02F 1/015* (2013.01); *H01L 23/544* (2013.01);
(Continued)

(58) Field of Classification Search
CPC ... H01L 29/78651; H01L 29/04; H01L 29/36; H01L 29/66757; H01L 27/1214; H01L 23/544
See application file for complete search history.

(56) References Cited

U.S. PATENT DOCUMENTS 6,597,043 B1 * 7/2003 Naem ................. H01L 29/0649
257/366
6,727,546 B2 * 4/2004 Krivokapic ....... H01L 29/42384
257/331
(Continued)

FOREIGN PATENT DOCUMENTS

| CN | 1877861 A | 12/2006 |
| CN | 101677094 A | 3/2010 |
| CN | 105576037 A | 5/2016 |

OTHER PUBLICATIONS

Feb. 14, 2017—International Search Report and Written Opinion Appn PCT/CN2016/104967 with Eng Tran.

*Primary Examiner* — Mark Tornow
(74) *Attorney, Agent, or Firm* — Banner & Witcoff, Ltd.

(57) ABSTRACT

A thin film transistor and manufacturing and testing methods thereof, an array substrate and a display device, and the thin film transistor includes a semiconductor layer, at least three source/drain electrodes and a gate electrode. The semiconductor layer includes a non-doped part which is continuously formed and at least three doped parts which are connected with the non-doped part; the doped parts are spaced from each other and distributed at a periphery of the non-doped part; the source/drain electrodes are spaced from each other and respectively electrically connected with the doped parts; and the gate electrode overlaps the non-doped part in a direction perpendicular to the semiconductor layer and at least extends to a junction of the non-doped part and each doped part. The thin film transistor can improve the (Continued)

accuracy of comparison results of the characteristics of sub-thin film transistors included by the thin film transistor.

20 Claims, 8 Drawing Sheets

(51) Int. Cl.
| | |
|---|---|
| *H01L 29/36* | (2006.01) |
| *H01L 29/66* | (2006.01) |
| *H01L 23/544* | (2006.01) |
| *H01L 27/12* | (2006.01) |
| *H01L 29/04* | (2006.01) |
| *G02F 1/015* | (2006.01) |

(52) U.S. Cl.
CPC .......... *H01L 27/1214* (2013.01); *H01L 29/04* (2013.01); *H01L 29/36* (2013.01); *H01L 29/66757* (2013.01)

(56) References Cited

U.S. PATENT DOCUMENTS

| | | | | |
|---|---|---|---|---|
| 6,777,756 B2 * | 8/2004 | Ohguro | ............... | H01L 29/0692 257/331 |
| 7,288,800 B2 * | 10/2007 | Howard | .............. | H01L 29/0692 257/134 |
| 7,646,071 B2 * | 1/2010 | Ban | ......................... | H01L 21/84 257/335 |
| 8,896,062 B2 * | 11/2014 | Zhu | ................... | H01L 29/66795 257/347 |

* cited by examiner

THIN FILM TRANSISTOR, MANUFACTURING METHOD AND TESTING METHOD THEREOF, ARRAY SUBSTRATE AND DISPLAY DEVICE

The application is a U.S. National Phase Entry of International Application No. PCT/CN2016/104967 filed on Nov. 8, 2016, designating the United States of America and claiming priority to Chinese Patent Application No. 201610011702.9, filed on Jan. 8, 2016. The present application claims priority to and the benefit of the above-identified applications and the above-identified applications are incorporated by reference herein in their entirety.

TECHNICAL FIELD

Embodiments of the present disclosure relate to a thin film transistor, a manufacturing method and a testing method thereof, an array substrate and a display device.

BACKGROUND

A thin film transistor (TFT) is a commonly used switching element in the display field. The TFT generally includes a gate electrode, an active layer, and a source electrode and a drain electrode which are electrically connected with the active layer. The active layer is usually made of a semiconductor material such as polycrystalline silicon or monocrystalline silicon.

An array substrate is an important component of a display device. The array substrate generally includes a display region and a non-display region. A plurality of TFTs arranged in a matrix is usually disposed in the display region. For instance, each TFT may be configured to control the display state of at least one pixel unit in the display region of the array substrate.

SUMMARY

At least one embodiment of the present disclosure provides a thin film transistor and a manufacturing method and a testing method thereof, an array substrate and a display device, so as to improve the accuracy of comparison results of the characteristics of thin film transistors.

At least one embodiment of the present disclosure provides a thin film transistor which includes a gate electrode, a semiconductor layer and at least three source/drain electrodes; the semiconductor layer includes at least three doped parts and a non-doped part which is continuously formed and which is connected with each of the at least three doped parts, the at least three doped parts are spaced from each other and distributed at a periphery of the non-doped part; the at least three source/drain electrodes are spaced from each other and respectively electrically connected with the at least three doped parts; and the gate electrode overlaps the non-doped part in a direction perpendicular to the semiconductor layer, and the gate electrode at least extends to a junction of the non-doped part and each of the doped parts.

At least one embodiment of the present disclosure further provides a method for testing the thin film transistor. In the thin film transistor, the at least three doped parts includes a first doped part, a second doped part and a third doped part; the first doped part and the third doped part are disposed on two opposite sides of the non-doped part; the second doped part is disposed between the first doped part and the third doped part in a direction from the first doped part to the third doped part; and the at least three source/drain electrodes are respectively electrically connected with the at least three doped parts. The method includes: applying a first signal to the gate electrode of the thin film transistor, and acquiring a first test result by utilization of two source/drain electrodes which are respectively electrically connected with the first doped part and the third doped part; and applying a second signal to the gate electrode of the thin film transistor, and acquiring a second test result by utilization of two source/drain electrodes which are respectively electrically connected with two doped parts in the at least three doped parts, except the first doped part.

At least one embodiment of the present disclosure further provides an array substrate, which includes a display region and a non-display region disposed at a periphery of the display region, and a test area is disposed in the non-display region and provided with at least one thin film transistor as stated above.

At least one embodiment of the present disclosure further provides a display device which includes the array substrate as stated above.

At least one embodiment of the present disclosure further provides a method for manufacturing a thin film transistor, and the method includes: forming a semiconductor layer, so that the semiconductor layer includes at least three doped parts and a non-doped part which is continuously formed and which is connected with each of the at least three doped parts; and the at least three doped parts are spaced from each other and distributed at a periphery of the non-doped part; forming at least three source/drain electrodes, so that the at least three source/drain electrodes are respectively electrically connected with the at least three doped parts and spaced from each other; and forming a gate electrode which overlaps the non-doped part in a direction perpendicular to the semiconductor layer and at least extends to a junction of the non-doped part and each of the doped parts.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 1b is a schematic top view in which a plurality of thin film transistors (TFTs) are manufactured by utilization of the active layer patterns in FIG. 1a;

FIG. 3c is a schematic view illustrating the marking of the dimension of partial structures in the semiconductor layer as shown in FIG. 3a;

FIG. 4b is a schematic sectional view of the TFT provided by the first embodiment of the present disclosure along the A-A direction in FIG. 4a;

FIG. 5b is a schematic sectional view of the TFT provided by the first embodiment of the present disclosure along the B-B direction in FIG. 5a;

FIG. 7c is a schematic view illustrating the marking of the dimension of partial structures in the semiconductor layer as shown in FIG. 7a;

FIG. 10b is a schematic partial sectional view of an array substrate provided by a sixth embodiment of the present disclosure along the C-C direction and the D-D direction in FIG. 10a.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventor of the application noticed in the study that: as the materials such as polycrystalline silicon (poly-Si) and monocrystalline silicon (mono-Si) have different characteristics in multiple directions, the characteristics of the formed thin film transistor (TFT) are relevant to the extension direction of the active layer pattern, which requires the understanding of the optimal and worst extension directions of the active layer patterns corresponding to the characteristics of the TFT in the earlier stage of designing the entire display device (particularly the array substrate).

Figure 1A:
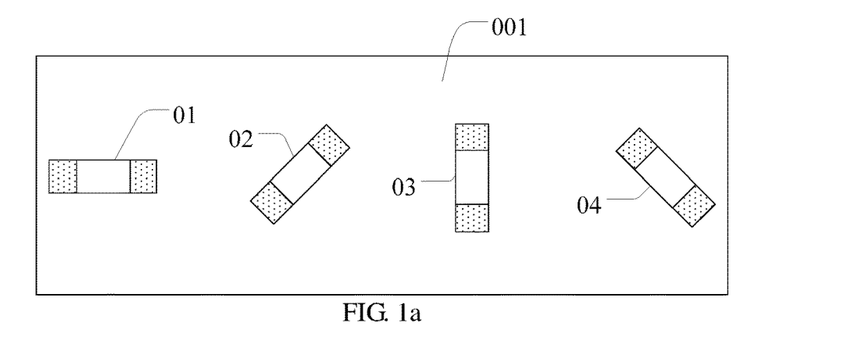
FIG. 1a is a schematic top view in which a plurality of active layer patterns are formed on a base substrate.
Figure 1B:
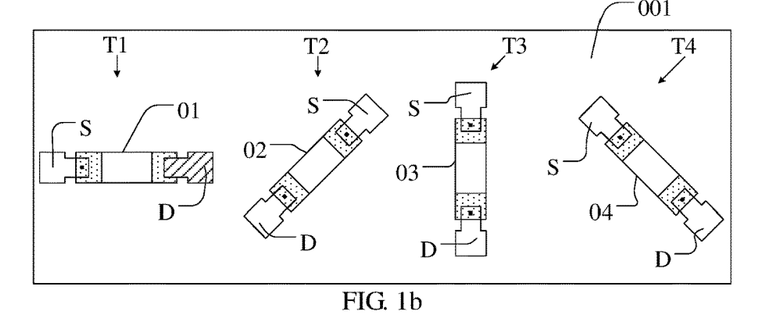

In order to test the relationship between the extension direction of the active layer pattern and the characteristics of the TFT, as shown in FIG. 1a, active layer patterns 01 to 04 with same shape (including outline and dimension) and different extension directions may be formed on a base substrate 001 by the same active layer film, and linear TFTs T1 to T4 are respectively manufactured by utilization of the active layer patterns 01 to 04, as shown in FIG. 1b; subsequently, the characteristics of the TFTs are respectively tested through source electrodes S and drain electrodes D of the TFTs; and the relationship between the characteristics of a TFT and the extension direction of an active layer pattern may be obtained by comparing the characteristics of the TFTs, and then guiding conclusion useful for design can be obtained.

Although the conclusion obtained by the above method can be used for reference, as the difference (e.g., short roughness uniformity (SRU)) between the TFTs at different positions of the array substrate is not considered, even the distance between the TFTs at different positions is small, the comparison results obtained by the above method are also inaccurate.

At least one embodiment of the present disclosure relates to a thin film transistor (TFT), a manufacturing method and a testing method thereof, an array substrate and a display device. The TFT includes a semiconductor layer, at least three source/drain electrodes and a gate electrode. The semiconductor layer includes at least three doped parts and a non-doped part which is continuously formed and which is connected with each of the at least three doped parts; the at least three doped parts are spaced from each other and distributed at the periphery of the non-doped part; the at least three source/drain electrodes are spaced from each other and respectively electrically connected with the at least three doped parts; and the gate electrode overlaps the non-doped part in the direction perpendicular to the semiconductor layer, and at least extends to a junction of the non-doped part and the doped part.

The TFT provided by the embodiment of the present disclosure may allow the characteristics of a plurality of sub-TFTs in the TFT to be only relevant to the extension direction of an active layer pattern, and hence can improve the accuracy of comparison results when the characteristics of the sub-TFTs are compared with each other.

The TFT provided by the embodiment of the present disclosure may be used for comparing the characteristics of the sub-TFTs such as on-state current (Ion), off-state current (Ioff), subthreshold swing (SS), charge mobility, cut-in voltage (Vth) and capacitance-voltage (C-V). In some embodiments, an extension direction of the active layer pattern may also be selected according to the comparison results of the characteristic of the sub-TFTs, so that the TFT manufactured by utilization of the active layer pattern with the extension direction can have better performances. The embodiment of the present disclosure includes but not limited thereto.

Description will be given below to the TFT, the manufacturing method and the testing method thereof, the array substrate and the display device, provided by the embodiment of the present disclosure, with reference to the accompanying drawings.

First Embodiment

Figure 2:
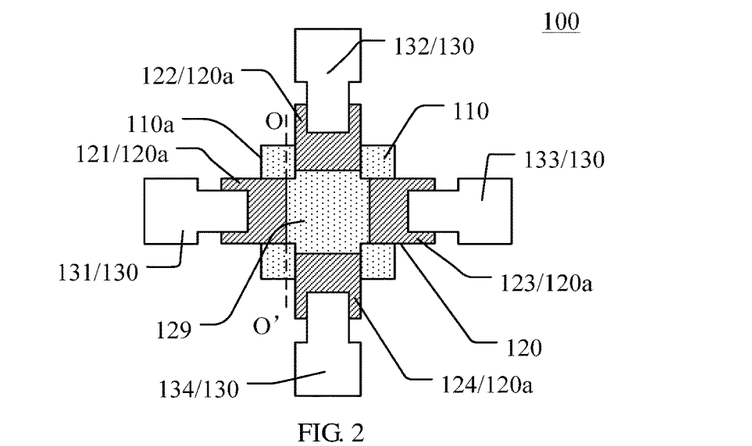
FIG. 2 is a schematic plan view of a TFT provided by a first embodiment of the present disclosure.

The embodiment provides a TFT. As illustrated in FIG. 2, the TFT 100 includes a semiconductor layer 120, at least three source/drain electrodes 130 and a gate electrode 110; the semiconductor layer 120 includes at least three doped parts 120a and a non-doped part 129 which is continuously formed and which is connected with each of the at least three doped parts 120a; the at least three doped parts 120a are spaced from each other and distributed at the periphery of the non-doped part 129; the at least three source/drain electrodes 130 are spaced from each other and respectively electrically connected with the at least three doped parts 120a; and the gate electrode 110 overlaps the non-doped part 129 in the direction perpendicular to the semiconductor layer 120 and at least extends to a junction of the non-doped part 129 and each of the doped parts 120a. For instance, the gate electrode 110 at least extends to a junction O-O' of the non-doped part 129 and a first doped part 121 (description is given in FIG. 2 by taking the case that an end portion 110a of the gate electrode 110, close to the first doped part 121, exceeds the junction as an example). Portions of the gate electrode, respectively close to other doped parts, also adopt similar settings.

In the embodiment, the gate electrode overlaps the non-doped part in the direction perpendicular to the semiconductor layer and at least extends to the junction of the non-doped part and each doped part, which ensures that the non-doped part and each of the doped parts can be electrically communicated when an electrical signal is applied to the semiconductor layer of the TFT through the gate electrode, so that the TFT can operate normally. It should be noted that: the description that the gate electrode overlaps the non-doped part in the direction perpendicular to the semiconductor layer refers to that the gate electrode at least partially overlaps the non-doped part in the direction perpendicular to the semiconductor layer. In some embodiments, the gate electrode may be set to include portions not overlapping the non-doped part in the direction perpendicular to the semiconductor layer according to actual demands, as long as the TFT can be guaranteed to operate normally.

Description is given in the embodiment by taking the case that the planar shape of the semiconductor layer 120 is roughly cross-shaped as an example. In this case, the at least three doped parts 120a include a first doped part 121, a second doped part 122, a third doped part 123 and a fourth doped part 124 which are arranged at the periphery of the non-doped part 129 in sequence, as shown in FIG. 2. Correspondingly, the at least three source/drain electrodes 130 include source/drain electrodes 131, 132, 133 and 134 disposed at the periphery of the non-doped part 129 in turn; the source/drain electrode 131 is electrically connected with the first doped part 121; the source/drain electrode 132 is electrically connected with the second doped part 122; the source/drain electrode 133 is electrically connected with the third doped part 123; and the source/drain electrode 134 is electrically connected with the fourth doped part 124.

For instance, the TFT 100 provided by the embodiment of the present disclosure may be utilized to compare the characteristics of a plurality of sub-TFTs in the TFT by at least one of the first mode or the second mode.

First mode: for instance, the TFT 100 in FIG. 2 may include a first sub-TFT and a second sub-TFT; the first sub-TFT includes the gate electrode 110, the first doped part 121 and the third doped part 123 of the semiconductor layer 120, and two source/drain electrodes 131 and 133 which are respectively electrically connected with the first doped part and the third doped part and respectively taken as a source electrode and a drain electrode of the first sub-TFT; and the second sub-TFT includes the gate electrode 110, the second doped part 122 and the fourth doped part 124 of the semiconductor layer 120, and two source/drain electrodes 132 and 134 which are respectively electrically connected with the second doped part and the fourth doped part and respectively taken as a source electrode and a drain electrode of the second sub-TFT. In the first mode, the characteristic of each of the two sub-TFTs may be tested through the source electrode and the drain electrode of the first sub-TFT or the second sub-TFT correspondingly, and subsequently, the characteristics of the two sub-TFTs may be compared.

In the first mode, both an active layer pattern (including the first doped part, the third doped part and the non-doped part) of the first sub-TFT and an active layer pattern (including the second doped part, the fourth doped part and the non-doped part) of the second sub-TFT extend along a straight line, for instance, respectively extend along the horizontal direction and the vertical direction in FIG. 2. Thus, the first mode can realize the comparison between the characteristics of a plurality of linear TFTs.

Second mode: for instance, the TFT 100 in FIG. 2 may include a first sub-TFT and a second sub-TFT; the first sub-TFT includes the gate electrode 110, the first doped part 121 and the third doped part 123 of the semiconductor layer 120, and two source/drain electrodes 131 and 133 which are respectively electrically connected with the first doped part and the third doped part and respectively taken as a source electrode and a drain electrode of the first sub-TFT; and the second sub-TFT includes the gate electrode 110, the first doped part 121 and the second doped part 122 of the semiconductor layer 120, and two source/drain electrodes 131 and 132 which are respectively connected with the first doped part and the second doped part and respectively taken as a source electrode and a drain electrode of the second sub-TFT. In the second mode, the characteristic of each of the two sub-TFTs may be tested through the source electrode and the drain electrode of the first sub-TFT or the second sub-TFT correspondingly, and subsequently, the characteristics of the two sub-TFTs may be compared.

That is to say, the difference between the second mode and the first mode is that: in the second mode, the second sub-TFT includes the first doped part and the second doped part and corresponding source/drain electrodes.

In the embodiment, the planar shape of the semiconductor layer 120 is cross-shaped. Thus, when the second mode is adopted, the planar shape of an active layer pattern (including the first doped part, the second doped part and the non-doped part) of the second sub-TFT is L-shaped, namely the second sub-TFT is an L-shaped TFT. Therefore, the second mode can realize the comparison between the characteristics of a linear TFT and an L-shaped TFT.

Figure 3A:
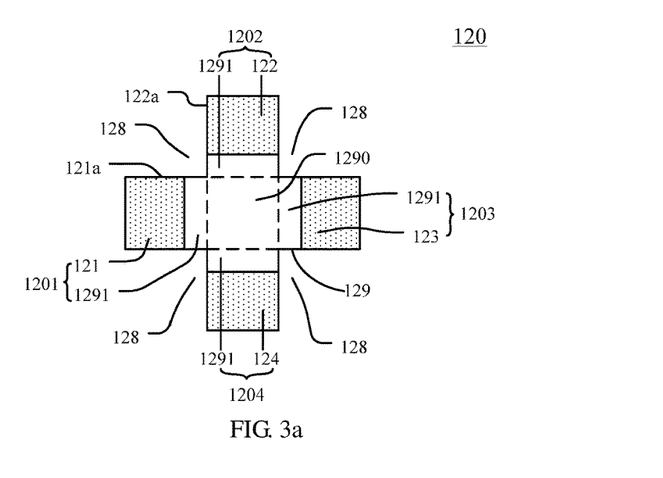
FIG. 3a is a schematic plan view of a semiconductor layer of the TFT provided by the first embodiment of the present disclosure.
Figure 3B:
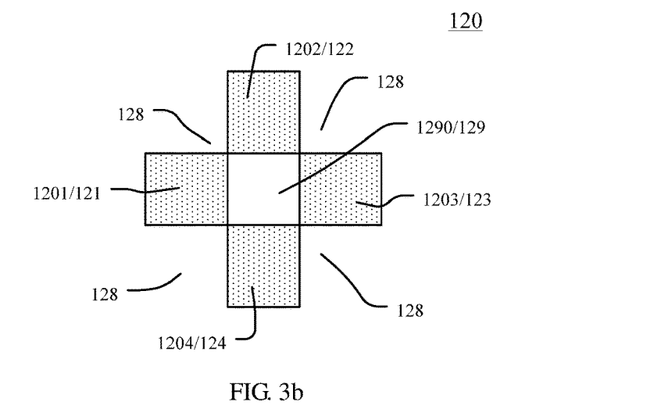
FIG. 3b is a schematic plan view of a semiconductor layer of the TFT provided by the first embodiment of the present disclosure.

In the first mode and the second mode, as channel regions (each channel region is a channel across which the current between the source electrode and the drain electrode flows) of the active layer patterns of the first sub-TFT and the second sub-TFT have overlapped portions (namely the current from the source electrode to the drain electrode of each of the first sub-TFT and the second sub-TFT flows across at least the same part of a central non-doped portion 1290 in FIGS. 3a and 3b), so that the characteristics of the first sub-TFT and the second sub-TFT are only relevant to the extension directions of the active layer patterns. Therefore, the TFT provided by the embodiment can improve the accuracy of the comparison results of the characteristics of the sub-TFTs in the TFT. On the other hand, the TFT can more accurately reflect the correlativity between the characteristics of the plurality of sub-TFTs in the TFT and the extension directions of the active layer patterns.

Detailed description will be given below to the semiconductor layer 120, of which the planar shape is roughly cross-shaped, in the TFT 100 as shown in FIG. 2, with reference to FIGS. 3a and 3b.

As shown in FIGS. 3a and 3b, within a plane where the semiconductor layer 120 is located, the semiconductor layer 120 may include a central non-doped portion 1290 and four protrusions 1201-1204 which are adjacent to and connected with the central non-doped portion 1290; a concave 128 is formed between every two adjacent protrusions of which the extension directions intersect with each other; each protrusion includes one doped part; for instance, the first protrusion 1201 includes the first doped part 121; the second protrusion 1202 includes the second doped part 122; the third protrusion 1203 includes the third doped part 123; the fourth protrusion 1204 includes the fourth doped part 124; and the non-doped part 129 includes the central non-doped portion 1290.

In the embodiment, the planar shape of the semiconductor layer includes a plurality of protrusions protruding from the edge of the semiconductor layer; a concaves is formed between adjacent protrusions with extension directions intersecting with each other; each protrusion includes one doped part; and the doped part is disposed on one side, away from the center of the central non-doped portion, of the protrusion. In this way, the channel regions of the first sub-TFT and the second sub-TFT can have overlapping portions when the characteristics of the first sub-TFT and the second sub-TFT (particularly the L-shaped sub-TFT and the linear sub-TFT) are compared by adoption of the first mode and/or the second mode, so that the accuracy of the comparison results can be improved.

As the planar shape of the semiconductor layer 120 in the TFT 100 provided by the embodiment is cross-shaped, as shown in FIGS. 3a and 3b, among the protrusions 1201-1204, the first protrusion 1201 and the third protrusion 1203 are respectively disposed on two opposite sides of the non-doped part 129 and have opposite protruding directions; and the second protrusion 1202 and the fourth protrusion 1204 are respectively disposed on two opposite sides of the non-doped part 129 and have opposite protruding directions.

In FIG. 3a, each protrusion also includes an edge non-doped portion 1291 close to the central non-doped portion 1290. That is to say, each protrusion includes the doped part 120a and the edge non-doped portion 1291; the doped part 120a of the protrusion is disposed on one side, away from the central non-doped portion 1290, of the edge non-doped portion 1291 of the protrusion. Moreover, the non-doped part 129 not only includes the central non-doped portion 1290 but also includes the edge non-doped portion 1291 of each protrusion. That is to say, in the case as shown in FIG. 3a, the planar shape of the non-doped part 129 includes four edge non-doped portions 1291 protruding from the edge of the non-doped part 129, and a concave is formed between every two adjacent edge non-doped portions.

In FIG. 3b, each protrusion completely overlaps the doped part included by the each protrusion, and the non-doped part 129 completely overlaps the central non-doped portion 1290 included by the non-doped part 129.

Compared with the semiconductor layer as shown in FIG. 3a, when the TFT 100 provided by the embodiment adopts the semiconductor layer as shown in FIG. 3b, the channel regions of the first sub-TFT and the second sub-TFT in each of the first mode and the second mode have more overlapping portions, so the comparison results of the characteristics of the first sub-TFT and the second sub-TFT can be more accurate.

Compared with the case as shown in FIG. 3b, the manufacturing process of the non-doped part 129 in the semiconductor layer as shown in FIG. 3a is simpler. The reason is that: the manufacturing process of the semiconductor layer 120, for instance, may include the step of forming a semiconductor layer pattern by patterning a semiconductor film (for instance, including steps such as exposure, development and etching) and forming the doped parts by performing, for instance, ion implantation on the semiconductor layer pattern. In the case as shown in FIG. 3a, a component for shielding the non-doped part 129 during ion implantation may be manufactured to cover the entire central non-doped portion 1290 and include parts each slightly exceeding the edge of the central non-doped portion 1290, so the requirement on the production accuracy can be reduced.

In the embodiment, a small proportion of the edge non-doped portion 1291 to the channel region of corresponding sub-TFT may be obtained by control of the dimension of the edge non-doped portion, so that the difference between the channel regions of the first sub-TFT and the second sub-TFT can be reduced, and hence the accuracy of the comparison results of the characteristics of the first sub-TFT and the second sub-TFT can be improved. Description will be given below with reference to FIG. 3c.

For instance, the ratio of the dimension of the edge non-doped portion in each protrusion to the dimension of the non-doped part, in the direction from the each protrusion to the central non-doped portion, may be less than or equal to one seventh.

Figure 3C:
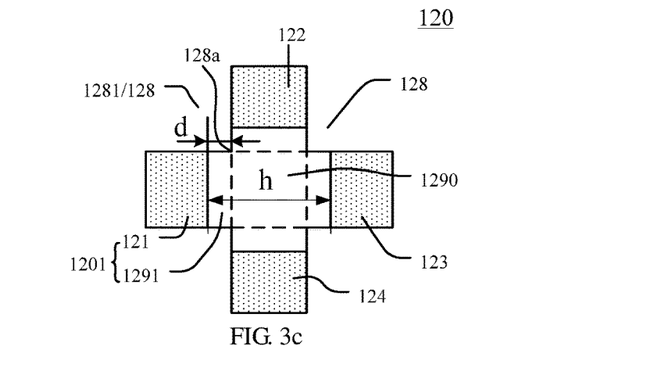

For instance, as shown in FIG. 3c, in the direction from the first protrusion 1201 to the central non-doped portion 1290, the dimension of the edge non-doped portion 1291 in the first protrusion 1201 is d (namely the distance from the first doped part 121 to an end portion 128a of an adjacent concave 1281, close to the central non-doped portion 1290 and the first protrusion 1201, is d); in the direction from the first protrusion 1201 to the central non-doped portion 1290, the dimension of the non-doped part is h; and the ratio of d to h may be less than or equal to one seventh.

For instance, in the direction from each protrusion to the central non-doped portion, the dimension of the edge non-doped portion in the each protrusion may be greater than 0 μm and less than 1 μm, for example, greater than 0 μm and less than or equal to 0.5 μm.

For instance, as shown in FIG. 3c, the dimension d may be greater than 0 μm and less than 1 μm, preferably greater than 0 μm and less than or equal to 0.5 μm. For instance, in the direction from the first protrusion 1201 to the central non-doped portion 1290, when the dimension d is 0.5 μm, the dimension of the central non-doped portion may be greater than or equal to 3 μm. In this case, the dimension h of the non-doped part may be greater than or equal to 4 μm. The ratio of d to h is less than or equal to one eighth.

For instance, edges, close to each other, of adjacent protrusions may be intersected. For instance, as shown in FIG. 3a, edges 121a and 122a, close to each other, of the first protrusion 1201 and the second protrusion 1202 may intersect with each other. By allowing the edges, close to each other, of the adjacent protrusions to intersect with each other, it is facilitated that the channel regions of the first sub-TFT and the second sub-TFT can have overlapping portions at the position of the central non-doped portion, so that the difference between the channel regions of the first sub-TFT and the second sub-TFT can be reduced, and hence the accuracy of the comparison results of the characteristics of first sub-TFT and the second sub-TFT can be improved.

In the embodiment, the planar shape of the concave between the adjacent protrusions may have an angular structure at a position close to the central non-doped portion; two sides of the angular structure are respectively the edges, close to each other, of the adjacent protrusions; and the angular structure is a right angle structure.

For instance, as shown in FIGS. 3a and 3b, when the first mode is adopted, the planar shapes of the first, second, third and fourth protrusions 1201-1204 may be same, and the planar shapes of the first, second, third and fourth doped parts 121-124 may be same. For instance, when the second mode is adopted, the planar shapes of the first, second and third protrusions 1201-1203 may be same, and the planar shapes of the first, second and third doped parts 121-123 may be same. This helps to reduce the difference between the first sub-TFT and the second sub-TFT, and hence the accuracy of the comparison results of the characteristics of the first sub-TFT and the second sub-TFT can be improved.

For instance, the material of the semiconductor layer 120 may be poly-Si or mono-Si. Of course, the material of the semiconductor layer 120 may also be other semiconductor materials being commonly used in the field and having different characteristics in a plurality of directions.

The positional relationship between the gate electrode 110 and the semiconductor layer 120 is not limited in the embodiment. The TFT 100 provided by the embodiment may be a bottom-gate structure or a top-gate structure.

For instance, as shown in FIG. 2, the TFT 100 is a bottom-gate structure, and the gate electrode 110 is covered by the semiconductor layer 120.

Figure 4A:
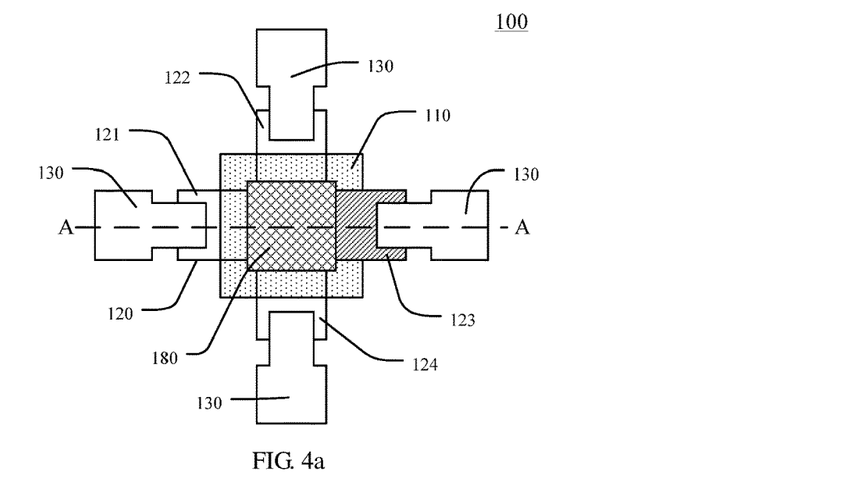
FIG. 4a is a schematic plan view of a TFT provided by the first embodiment of the present disclosure.
Figure 4B:
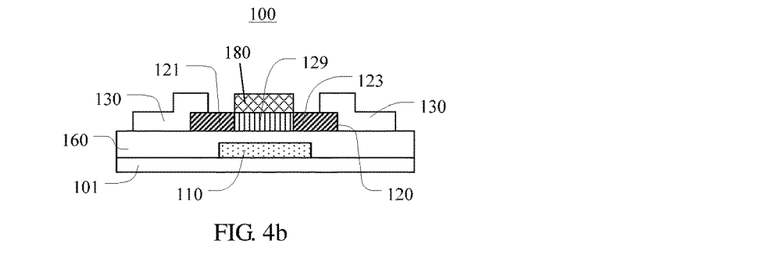

For instance, when the TFT 100 is a bottom-gate structure, in order to shield the non-doped part 129 in the process of forming the semiconductor layer 120, as shown in FIGS. 4a and 4b, the TFT 100 may also include a shielding layer 180 which covers the semiconductor layer 120, and the shielding layer 180 overlaps the non-doped part 129 and does not overlaps the doped parts 121-124 in the direction perpendicular to the semiconductor layer 120.

In the case as shown in FIGS. 4a and 4b, in order to ensure that the TFT 100 can operate normally, for instance, an orthographic projection, on the plane where the gate electrode 110 is located, of the shielding layer 180 may be disposed within an area where the gate electrode 110 is located.

Figure 5A:
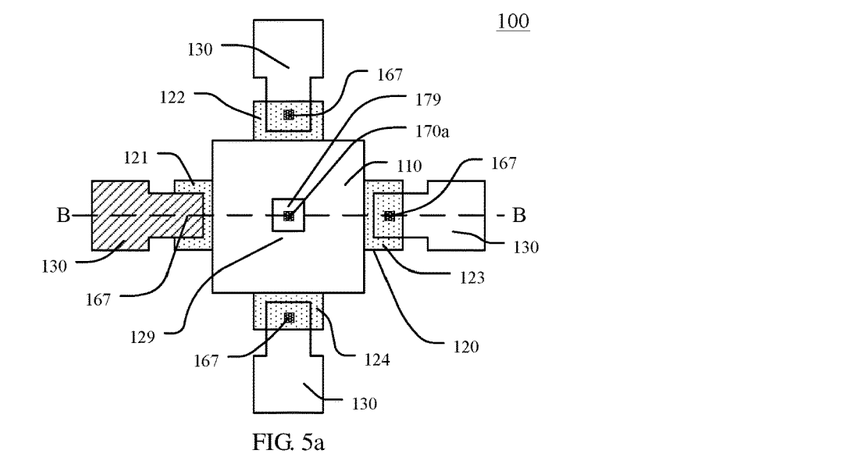
FIG. 5a is a schematic plan view of a TFT provided by the first embodiment of the present disclosure.
Figure 5B:
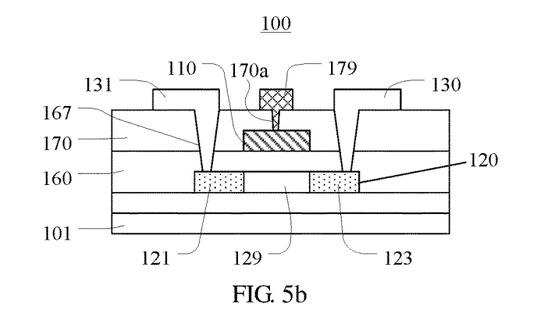

For instance, as shown in FIGS. 5a and 5b, the TFT 100 is a top-gate structure, namely the gate electrode 110 covers the semiconductor layer 120. In this case, the gate electrode 110 may be utilized to shield the semiconductor layer pattern in the ion implantation process of forming the semiconductor layer, so as to simplify the manufacturing process of the TFT 100.

In addition, as shown in FIGS. 4b and 5b, the TFT 100 may further include a gate insulating layer 160 disposed between the semiconductor layer 120 and the gate electrode 110, so that the semiconductor layer 120 and the gate electrode 110 can be insulated from each other.

In a case that the gate electrode 110 covers the semiconductor layer 120, for instance, as shown in FIG. 5b, the TFT 100 may further include a passivation layer 170 covering the gate electrode 110. In this case, for instance, each source/drain electrode 130 may be electrically connected with corresponding doped part via a through hole 167 running through the gate insulating layer 160 and the passivation layer 170. The embodiment of the present disclosure includes but not limited thereto. For instance, each source/drain electrode may also be electrically connected with corresponding doped part via a through hole running through the gate insulating layer 160 or the passivation layer 170.

For instance, the gate electrode 110 may also be electrically connected with corresponding gate line 179 via a through hole 170a in the passivation layer 170. Of course, the gate line 179 may also be integrally formed with the gate electrode 110 to apply an electrical signal to the gate electrode 100.

Second Embodiment

Figure 6A:
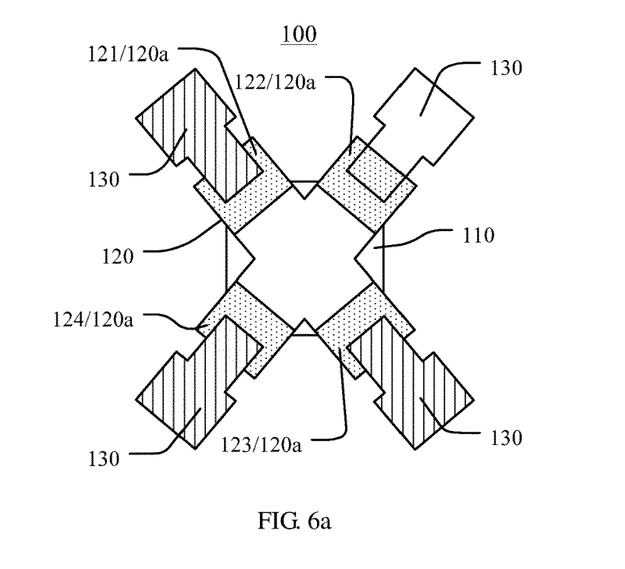
FIG. 6a is a schematic plan view of a TFT provided by a second embodiment of the present disclosure.
Figure 6B:
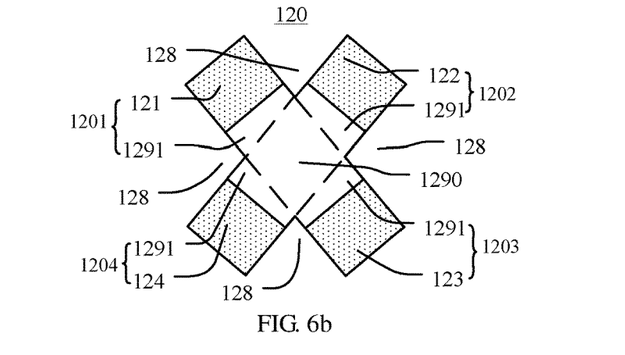
FIG. 6b is a schematic plan view of a semiconductor layer of the TFT provided by the second embodiment of the present disclosure.

The present embodiment provides a TFT. As illustrated in FIGS. 6a and 6b, the difference between the TFT 100 provided by the present embodiment and the first embodiment is mainly that: the planar shape of the semiconductor layer 120 is X-shaped.

The TFT provided by the embodiment may adopt at least one of the first mode or the second mode in the first embodiment to compare the characteristics of a plurality of sub-TFTs in the TFT. When the first mode is adopted, the extension direction of an active layer pattern of a first sub-TFT (the direction from a first protrusion 1201 to a third protrusion 1203) is intersected with but not perpendicular to the extension direction of an active layer pattern of a second sub-TFT (the direction from a second protrusion 1202 to a fourth protrusion 1204). When the second mode is adopted, the extension direction of the active layer pattern of the first sub-TFT is similar to the case when the first mode is adopted, and the angle between protruding directions of the first protrusion 1201 and the second protrusion 1202 included by the active layer pattern of the second sub-TFT is an acute angle (as shown in FIG. 6b) or an obtuse angle.

For instance, as shown in FIG. 6b, the planar shape of a non-doped part (as shown by an unfilled part in the middle of the semiconductor layer in FIG. 6b) may include four edge non-doped portions 1291 protruding from the edge of the non-doped part, and concaves are formed between adjacent edge non-doped parts 1291. The non-doped part has simple manufacturing process. The dimension of the edge non-doped portion 1291 may refer to relevant description in the first embodiment. No further description will be given here.

For instance, edges, close to each other, of adjacent protrusions may intersect. In this case, as shown in FIG. 6b, the planar shape of a concave 128 between the adjacent protrusions is of an acute angle structure or an obtuse angle structure, and two sides of the acute angle structure or the obtuse angle structure are respectively the edges, close to each other, of the adjacent protrusions. In this way, channel regions of the first sub-TFT and the second sub-TFT can have overlapping portions at the position of a central non-doped portion, so as to improve the accuracy of the comparison results of the characteristics of the first sub-TFT and the second sub-TFT.

For instance, other setting modes of the TFT provided by the embodiment may refer to relevant description in the first embodiment. No further description will be given here.

Description is given in the first embodiment and the second embodiment by taking the case that the semiconductor layer includes four protrusions as an example. Of course, the semiconductor layer may also include three, five or more than five protrusions. For instance, in an embodiment of the present disclosure, the semiconductor layer preferably includes an even number of protrusions, and this facilitates the plurality of sub-TFTs in the TFT manufactured by adoption of the semiconductor layer to be linear TFTs, so that the structure of the TFT can be simplified and the utilization rate of the doped parts included by the protrusions can be improved.

Third Embodiment

Figure 7A:
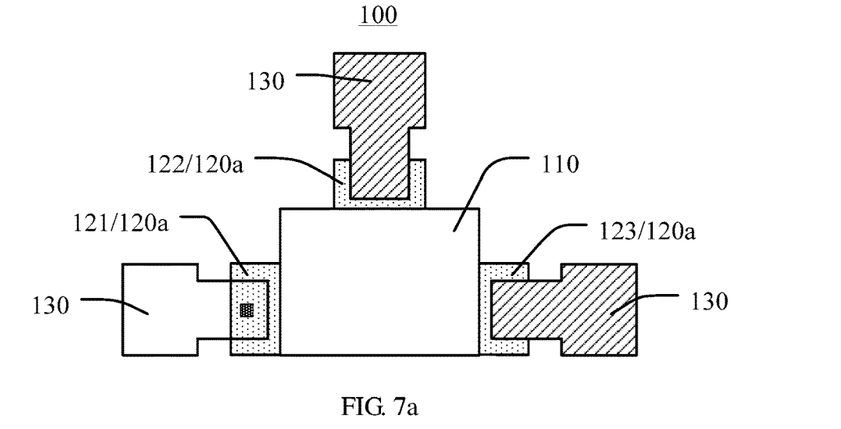
FIG. 7a is a schematic plan view of a TFT provided by a third embodiment of the present disclosure.
Figure 7B:
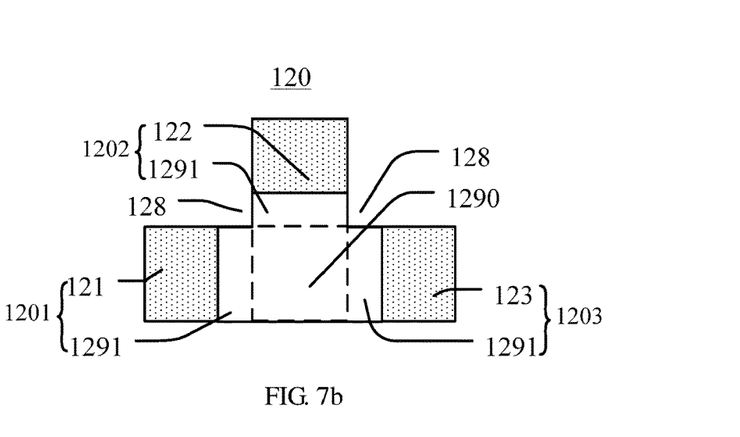
FIG. 7b is a schematic plan view of a semiconductor layer of the TFT provided by the third embodiment of the present disclosure.

The embodiment provides a TFT. As shown in FIGS. 7a and 7b, the planar shape of a semiconductor layer 120 of the TFT 100 is T-shaped. That is to say, within a plane where the semiconductor layer 120 is located, the semiconductor layer 120 includes a central non-doped portion 1290 and three protrusions 1201-1203 which are adjacent to and connected with the central non-doped portion 1290; no concave is formed between the first protrusion 1201 and the third protrusion 1203, adjacent to each other, due to opposite protruding directions; the second protrusion 1202 and each of the first protrusion 1201 and the third protrusion 1203 are adjacent to each other and have intersected protruding direction, so that the concave 128 can be formed therebetween; each protrusion includes one doped part; and a non-doped part (as shown by an unfilled part in the middle of the semiconductor layer 120 in FIG. 7b) includes the central non-doped portion 1290. Correspondingly, the TFT also includes three source/drain electrodes 130.

The TFT provided by the embodiment may adopt the second mode in the first embodiment to realize the comparison between the characteristics of a linear TFT and an L-shaped TFT.

For instance, the ratio of the dimension of the edge non-doped portion in each protrusion to the dimension of the non-doped part, in the direction from the each protrusion to the central non-doped portion, may be less than or equal to one seventh.

Figure 7C:
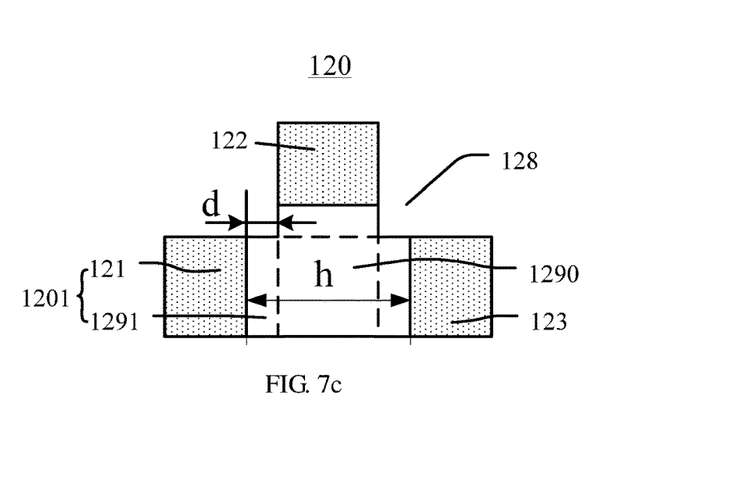

For instance, as shown in FIG. 7c, in the direction from the first protrusion 1201 to the central non-doped portion 1290, the dimension d of the edge non-doped portion 1291 included by the first protrusion 1201 may be greater than 0 μm and less than 1 μm, preferably greater than 0 μm and less than or equal to 0.5 μm, and the dimension of the central non-doped portion may be greater than or equal to 3 μm.

For instance, when the dimension d is 0.5 μm, the dimension h of the non-doped part may be greater than or equal to 3.5 μm. In this case, the ratio of d to h may be less than or equal to one seventh.

The semiconductor layer 120 of the TFT provided by the embodiment may be arranged with reference to parts of the semiconductor layer in the first embodiment except the fourth protrusion. No further description will be given here.

Description is given in the first, second and third embodiments by respectively taking the case that the planar shape of the semiconductor layer is cross-shaped, X-shaped and T-shaped as an example. Of course, the planar shape of the semiconductor layer, including at least three protrusions, in the embodiment of the present disclosure includes but not limited thereto. For instance, the manufactured TFT can adopt at least one of the first mode or the second mode for test as long as the semiconductor layer satisfies the following conditions: the planar shape of the semiconductor layer includes a central non-doped portion and at least three protrusions which are adjacent to and connected with the central non-doped portion, and a concave is formed between mutually adjacent protrusions with intersected protruding directions; each protrusion includes one doped part; and the non-doped part includes the central non-doped portion.

As the linear TFT has simpler structure, in order to simplify the structure of the TFT, the at least three protrusions of the semiconductor layer may at least include two protrusions which are respectively disposed on two opposite sides of the non-doped part and have opposite protruding directions (for instance, the first protrusion and the third protrusion in the first, second and third embodiments, or the second protrusion and the fourth protrusion in the first and second embodiments), so that the linear TFT can be formed by utilization of the two protrusions.

In addition, in the TFT provided by the embodiment of the present disclosure, the number of the protrusions in the semiconductor layer 120 may also be less than three. For instance, the planar shape of the semiconductor layer may be a regular polygon. Description will be given below by taking the fourth embodiment as an example.

Fourth Embodiment

Figure 8A:
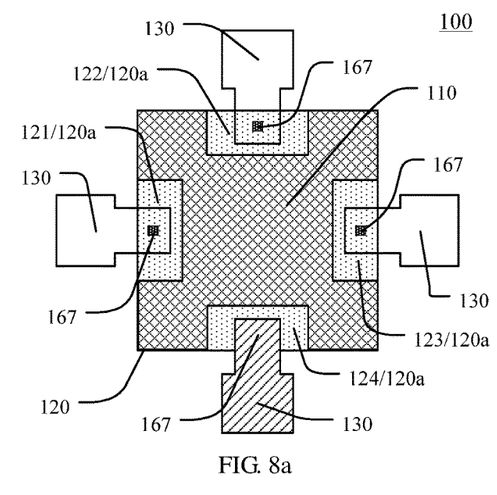
FIG. 8a is a schematic plan view of a TFT provided by a fourth embodiment of the present disclosure.
Figure 8B:
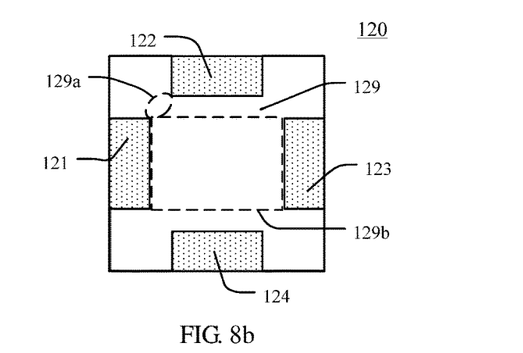
FIG. 8b is a schematic plan view of a semiconductor layer of the TFT provided by the fourth embodiment of the present disclosure.

The embodiment provides a TFT. As illustrated in FIGS. 8a and 8b, the TFT 100 includes a gate electrode 110, a semiconductor layer 120 and at least three source/drain electrodes 130; the semiconductor layer 120 includes a non-doped part 129 and at least three doped parts 120a which are respectively disposed at the periphery of the non-doped part 129; and the non-doped part 129 includes a portion 129a disposed between a first doped part 121 and a second doped part 122 in the direction from the first doped part 121 to the second doped part 122 adjacent to the first doped part 121.

As shown in FIGS. 8a and 8b, the semiconductor layer 120 includes four doped parts and the four doped parts are respectively the first doped part 121, the second doped part 122, a third doped part 123 and a fourth doped part 124 which are distributed at the periphery of the semiconductor layer 120 in sequence. Correspondingly, the number of source/drain electrodes 130 is 3. The embodiment of the present disclosure includes but not limited thereto.

When the TFT provided by the embodiment adopts the second mode to compare the characteristics of sub-TFTs in the TFT, the current from a source electrode to a drain electrode of a second sub-TFT may directly flow across the portion 129a (as shown in FIG. 8b) of the non-doped part 129; and when the first mode is adopted, the current of the second sub-TFT flows across a portion 129b (as shown in FIG. 8b) between the source electrode and the drain electrode. Thus, when the TFT provided by the embodiment adopts the first mode, compared with the second mode, channel regions of a first sub-TFT and the second sub-TFT have more overlapping portions, so that the accuracy of the comparison results can be further improved.

For instance, the planar shape of the semiconductor layer 120 may be a regular polygon such as a square or a regular hexagon. Thus, the channel regions of the first sub-TFT and the second sub-TFT can have a same shape, so that the accuracy of the comparison results of the characteristics of the first sub-TFT and the second sub-TFT can be improved.

Description is given in FIGS. 8a and 8b by taking the case that the planar shape of the semiconductor layer 120 of the TFT is a square as an example. When the planar shape of the semiconductor layer is a square, compared with the case of adopting other regular polygons, the channel regions of the first sub-TFT and the second sub-TFT have more overlapping portions, so that the accuracy of the comparison results of the characteristics of the first sub-TFT and the second sub-TFT can be improved.

Fifth Embodiment

The embodiment provides a method for testing the TFT provided by any foregoing embodiment. For instance, as shown in FIGS. 2, 6a, 7a and 8a, the TFT includes a gate electrode 110, a semiconductor layer 120 and at least three source/drain electrodes 130; the semiconductor layer 120 includes at least three doped parts 120a which are respectively electrically connected with the at least three source/drain electrodes; the at least three doped parts 120a include a first doped part 121, a second doped part 122 and a third doped part 123; the first doped part 121 and the third doped part 123 are disposed on two opposite sides of a non-doped part 129; and the second doped part 122 is disposed between the first doped part 121 and the third doped part 123 in the direction from the first doped part 121 to the third doped part 123. The method includes the following steps S51 and S52.

Step S51: applying a first signal to the gate electrode 110 of the TFT, and acquiring a first test result by utilization of two source/drain electrodes 130 which are respectively electrically connected with the first doped part 121 and the third doped part 123.

Step S52: applying a second signal to the gate electrode 110 of the TFT, and acquiring a second test result by utilization of two source/drain electrodes 130 which are respectively electrically connected with two doped parts in the at least three doped parts 120a except the first doped part 121 (for instance, the second and third doped parts 122 and 123 in FIGS. 2, 6a and 7a, or the second and fourth doped parts 122 and 124 in FIGS. 2, 6a and 8a).

It should be noted that the sequence of the steps S51 and S52 may be exchanged. In addition, the steps S51 and S52 are respectively executed to ensure the accuracy of the test results.

For instance, in the method for testing the TFT, provided by the embodiment, the first signal and the second signal may have equal voltage. Thus, when the characteristics, irrelevant to the gate electrode, of the plurality of sub-TFTs are compared, the signals applied to the gate electrode do not have an impact on the comparison results.

It should be noted that the embodiment includes but not limited to the case that the first signal and the second signal are equal. In actual application process, the first signal and the second signal may be adjusted according to actual demands, so as to acquire the first test result and the second test result. For instance, the parameter of the threshold voltage (Vth) of the TFT is obtained by respectively applying the first signal and the second signal, which are different from each other, to the gate electrode 110.

Figure 9A:
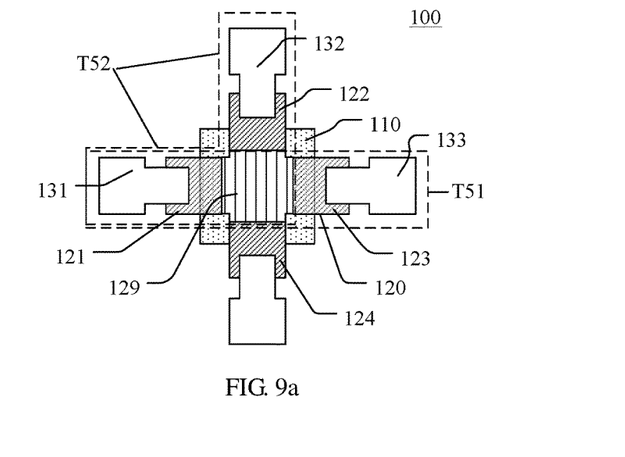
FIG. 9a is a schematic view of first and second sub-TFTs when a method for testing a TFT, provided by a fifth embodiment, adopts a second mode.

For instance, when the method for testing the TFT, provided by the embodiment, adopts the second mode, the at least three source/drain electrodes may include a source electrode, a first drain electrode and a second drain electrode, namely source/drain electrodes 131, 132 and 133 as shown in FIG. 9a are respectively the first drain electrode, the second drain electrode and the source electrode in sequence. The source electrode is electrically connected with the third doped part 123; the first drain electrode is electrically connected with the first doped part 121; and the second drain electrode is electrically connected with the second doped part 122. That is to say, a first sub-TFT T51 includes the source electrode and the first drain electrode, and a second sub-TFT T52 includes the source electrode and the second drain electrode. In the method, the second test result is acquired by utilization of the source electrode and the second drain electrode.

Or when the method for testing the TFT, provided by the embodiment, adopts the second mode, the at least three source/drain electrodes may include a drain electrode, a first source electrode and a second source electrode, namely the source/drain electrodes 131, 132 and 133 as shown in FIG. 9a are respectively the first source electrode, the second source electrode and the drain electrode in sequence. The drain electrode is electrically connected with the third doped part 123; the first source electrode is electrically connected with the first doped part 121; and the second source electrode is electrically connected with the second doped part 122. That is to say, the first sub-TFT T51 includes the drain electrode and the first source electrode, and the second sub-TFT T52 includes the drain electrode and the second source electrode. In the method, the second test result is acquired by utilization of the drain electrode and the second source electrode.

When the second mode is adopted, the testing method provided by the embodiment can improve the accuracy of the comparison results of the characteristics of the linear TFT and the L-shaped TFT.

Figure 9B:
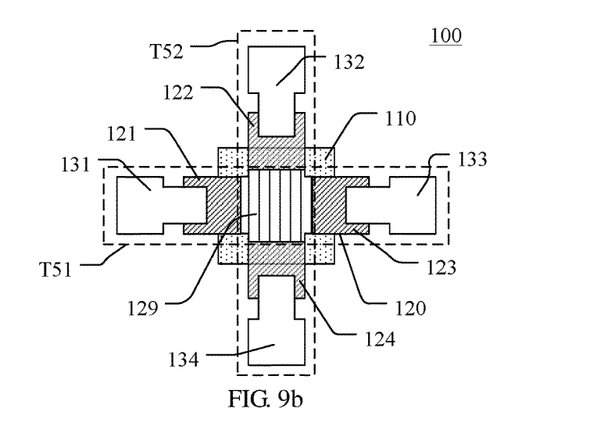
FIG. 9b is a schematic view of first and second sub-TFTs when the method for testing the TFT, provided by the fifth embodiment, adopts a first mode.

For instance, when the method for testing the TFT, provided by the embodiment, adopts the first mode, as shown in FIG. 9a, the at least three doped parts also include a fourth doped part 124; the second doped part 122 and the fourth doped part 124 are disposed between the first doped part 121 and the third doped part 123 in the direction from the first doped part 121 to the third doped part 123, and are respectively disposed on the other two opposite sides of the non-doped part 129; and the at least three source/drain electrodes include a first source electrode, a first drain electrode, a second source electrode and a second drain electrode, namely source/drain electrodes 131 and 133 as shown in FIG. 9b are respectively the first source electrode and the first drain electrode, and source/drain electrodes 132 and 134 are respectively the second source electrode and the second drain electrode. The first source electrode and the first drain electrode are respectively electrically connected with the first doped part 121 and the third doped part 123, and the second source electrode and the second drain electrode are respectively electrically connected with the second doped part 122 and the fourth doped part 124. That is to say, the first sub-TFT T51 includes the first source electrode and the first drain electrode, and the second sub-TFT T52 includes the second source electrode and the second drain electrode. In the method, the second test result is acquired by utilization of the second source electrode and the second drain electrode.

It should be noted that "respectively" here does not limit the order; for instance, the description that the first source electrode and the first drain electrode are respectively electrically connected with the first doped part 121 and the third doped part 123 indicates that one of the first source electrode and the first drain electrode is electrically connected with the first doped part 121 and the other is electrically connected with the third doped part 123; and so on.

When the first mode is adopted, the testing method provided by the embodiment can improve the accuracy of the comparison results of the characteristics of linear TFTs having active layer patterns with different extension directions.

For instance, in any example of the embodiment, both the first signal and the second signal may include a voltage signal, and both the first test result and the second test result may include a current value. The characteristics of sub-TFTs required to be compared may be analyzed by utilization of the first test result and the second test result, for instance, the current values, respectively obtained from the steps S51 and S52.

For instance, the method for testing the TFT, provided by the embodiment, may further include the step S53: comparing the obtained first test result and the obtained second test result.

Description is given in the embodiment to the method for testing the TFT, provided by the embodiment, by taking the case that the semiconductor layer of the TFT includes three or four doped parts as an example.

The method for testing the TFT, provided by the embodiment, is also applicable to the case that the semiconductor layer includes at least five doped parts. The testing method of this case may refer to the above method by analogy. No further description will be given here.

Sixth Embodiment

Figure 10A:
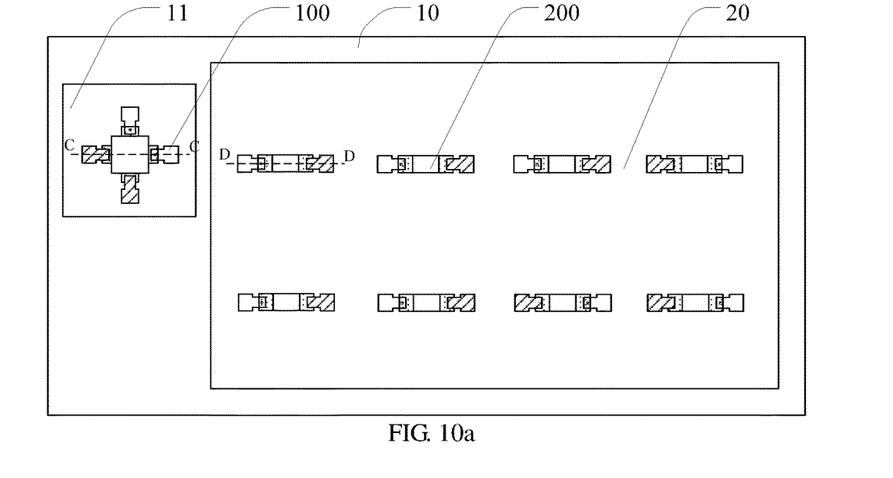
FIG. 10a is a schematic plan view of an array substrate provided by a sixth embodiment of the present disclosure.

The embodiment provides an array substrate. As illustrated in FIG. 10a, the array substrate includes a display region 20 and a non-display region 10 disposed at the periphery of the display region 20; and a test area 11 is disposed in the non-display region 10 and provided with at least one TFT 100 provided by any foregoing embodiment.

For instance, as shown in FIG. 10a, the display region 20 is provided with a plurality of display-region TFTs 200 arranged in a matrix, and the display-region TFTs 200 have same layer structure with the TFT 100 in the test area 11. The same layer structure here refers to that corresponding parts of the two kinds of TFTs are arranged in the same layer and made of a same material. However, whether the planar shape of each part of the two kinds of TFTs is same is not limited. For instance, as shown in FIG. 10b, a TFT 100 and a display-region TFT 200 are disposed on a base substrate 101; a gate electrode 210 of the display-region TFT 200 and a gate electrode 110 of the TFT 100 are arranged in the same layer and made of a same material; an active layer 220 of the display-region TFT 200 (for instance, including a non-doped part 229 and two doped parts 221 and 222) and a semiconductor layer 120 of the TFT 100 (only a first doped part 121, a non-doped part 129 and a third doped part 123 in the semiconductor layer 120 are shown in FIG. 10b) are arranged in the same layer and made of a same material; and source/drain electrodes 230 of the display-region TFT 200 and source/drain electrodes 130 of the TFT 100 are arranged in the same layer and made of a same material.

The TFT 100 in the test area and the display-region TFT 200 have a same layer structure, but the extension directions of active layer patterns of at least one part of a plurality of sub-TFTs (with reference to the description on the first sub-TFT and the second sub-TFT in the above embodiments) in the TFT 100 are different from the extension direction of the display-region TFT 200. Thus, in the case of abnormal performances of the array substrate, the TFT 100 in the test area may be tested by the testing method provided by the fifth embodiment, so as to determine whether the abnormal situation is relevant to the extension direction of the active layer patterns to a certain degree. Moreover, the accuracy of the test result can be improved by utilization of the TFT 100 in the array substrate provided by the embodiment for test.

For instance, supposing that the conclusion obtained in the earlier stage of designing the array substrate is that the TFT manufactured when the extension direction of the active layer pattern is along the horizontal direction in FIG. 10a has better performances compared with the case along the vertical direction, the active layer pattern of the display-region TFT in the manufactured array substrate extends along the horizontal direction; and in the case of abnormal performances of the array substrate, if the conclusion obtained by the test of the TFT 100 in the test area is, for instance, that the sub-TFT, in which the extension direction of the active layer pattern is along the vertical direction (not the horizontal direction) in FIG. 10a, has better performances, it can be determined that the reason of the abnormal situation may be caused by the abnormality of the characteristics of the material for preparing the semiconductor layer, in the selected extension direction of the active layer pattern.

Figure 10B:
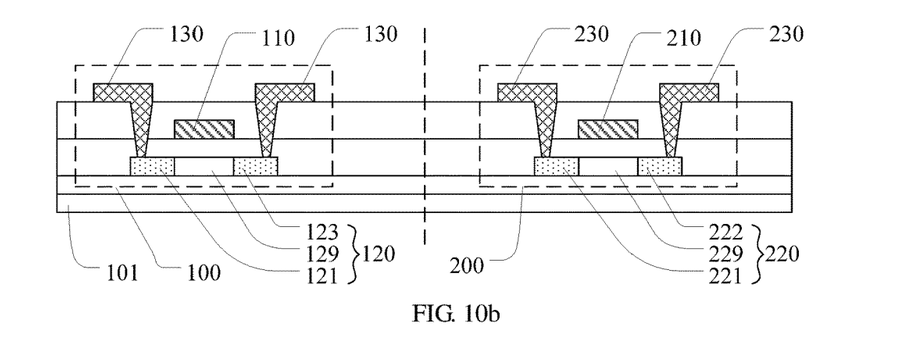

It should be noted that the structures of the array substrate as shown in FIGS. 10a and 10b are only illustrative; and the structure of the array substrate provided by the embodiment of the present disclosure includes but not limited thereto.

Seventh Embodiment

The embodiment provides a display device, which includes the array substrate provided by any foregoing embodiment.

In the case of an abnormal performance of the display device provided by the embodiment, the TFT in the test area of the array substrate may be tested by the testing method provided by the fifth embodiment, so as to determine whether the abnormal situation is relevant to the extension direction of the active layer pattern to a certain degree. Moreover, the test result has higher accuracy. The principle of this case may refer to relevant description in the sixth embodiment. No further description will be given here.

For instance, the display device provided by the embodiment may be any product or component with display function such as a liquid crystal display panel, e-paper, an organic light-emitting diode (OLED) panel, a mobile phone, a tablet PC, a TV, a display, a notebook computer, a digital picture frame and a navigator.

Eighth Embodiment

The embodiment provides a method for manufacturing the TFT provided by any foregoing embodiment. For instance, taking the TFT shown in FIG. 2 as an example, the method includes the following steps S81 to S83.

Step S81: forming a semiconductor layer 120, in which the semiconductor layer 120 includes at least three doped parts 120a and a non-doped part 129 which is continuously formed and which is connected with each of the at least three doped parts 120a, and the at least three doped parts 120a are spaced from each other and distributed at the periphery of the non-doped part 129.

Step S82: forming at least three source/drain electrodes 130 by a same film, in which the at least three source/drain electrodes 130 are respectively electrically connected with the at least three doped parts 120a and spaced from each other.

Step S83: forming a gate electrode 110, so that the gate electrode 110 can overlap the non-doped part 129 in the direction perpendicular to the semiconductor layer 120 and at least extend to a junction O-O' of the non-doped part 129 and each of the doped parts 120a.

It should be noted that the sequence of the steps S81, S82 and S83 may be randomly exchanged. For instance, the sequence of the steps S81 and S82 may be exchanged. For instance, the sequence of the steps S81 and S83 may be exchanged. No limitation will be given in the embodiment.

For instance, as for the TFT as shown in FIG. 5a, the method may include the following steps S8111 to S8131.

Figure 11A:
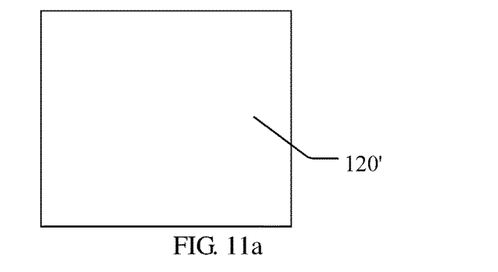
FIGS. 11a to 11d are schematic views illustrating steps of forming a semiconductor layer in a method for manufacturing a TFT, provided by an eighth embodiment of the present disclosure.
Figure 11B:
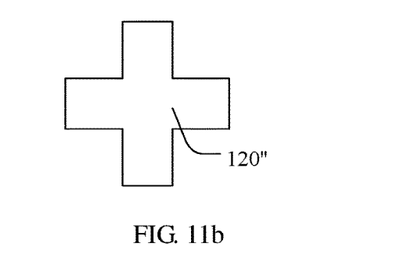

Step S8111: forming a semiconductor film 120', as shown in FIG. 11a; and forming a semiconductor layer pattern 120" by patterning the semiconductor film 120', as shown in FIG. 11b.

Figure 11C:
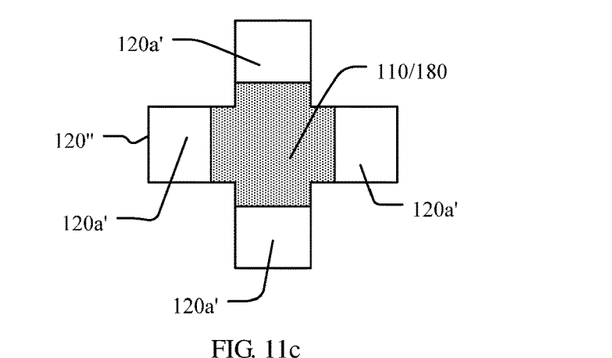

Step S8121: forming the gate electrode 110 on the semiconductor layer pattern 120", as shown in FIG. 11c.

Figure 11D:
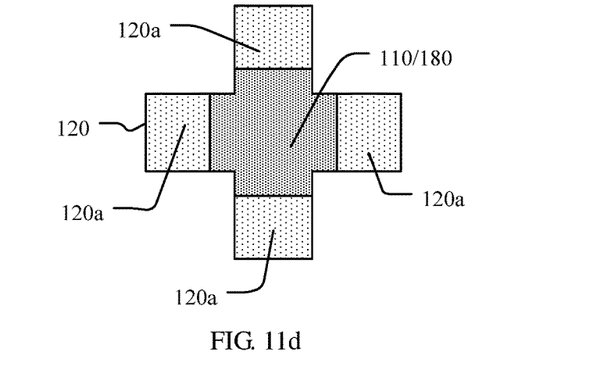

Step S8131: forming the doped parts 120a by performing ion implantation on a portion 120a' (as shown in FIG. 11c), not shielded by the gate electrode 110, of the semiconductor layer pattern 120", and forming the semiconductor layer 120, as shown in FIG. 11d.

For instance, as for the TFT as shown in FIG. 4a, the method may include the following steps S8112 to S8132.

Step S8112: forming a semiconductor film 120', as shown in FIG. 11a; and forming a semiconductor layer pattern 120" by patterning the semiconductor film 120', as shown in FIG. 11b.

Step S8122: forming a shielding layer 180 on the semiconductor layer pattern 120", as shown in FIG. 11c.

Step S8132: forming the doped parts 120a by performing ion implantation on a portion 120a', not shielded by the shielding layer 180, of the semiconductor layer pattern 120", and forming the semiconductor layer 120, as shown in FIG. 11d.

In summary, in the TFT, the manufacturing method and the testing method thereof, the array substrate and the display device, provided by the embodiments of the present disclosure, the TFT includes a plurality of sub-TFTs and the active layer patterns of the sub-TFTs have different extension directions. When the characteristics of the sub-TFTs are compared by adoption of the TFT, as the sub-TFTs have overlapped channel regions, the characteristics of the sub-TFTs are only relevant to the extension direction of the active layer patterns, so the TFT can improve the accuracy of the comparison results of the characteristics of the plurality of sub-TFTs in the TFT.

The following points are to be noted.

(1) In the accompanying drawings of the embodiments of the present disclosure, only the structures relevant to the embodiments of the present disclosure are involved, and other structures may refer to the prior art.

(2) The thicknesses and the shapes of the layers in the accompanying drawings do not reflect the true scale and are only intended to illustrate the content of the embodiments of the present disclosure.

(3) The embodiments of the present disclosure and the characteristics in the embodiments may be mutually combined without conflict.

What are described above is related to the illustrative embodiments of the disclosure only and not limitative to the scope of the disclosure; the scopes of the disclosure are defined by the accompanying claims.

This application claims the benefit of Chinese Patent Application No. 201610011702.9, filed on Jan. 8, 2016, which is hereby entirely incorporated by reference as a part of the present application.

What is claimed is:

1. A thin film transistor, comprising:
a semiconductor layer comprising at least three doped parts and a non-doped part which is continuously formed and which is connected with each of the at least three doped parts, wherein the at least three doped parts are spaced from each other and distributed at a periphery of the non-doped part;
at least three source/drain electrodes spaced from each other and respectively electrically connected with the at least three doped parts; and
a gate electrode overlapping the non-doped part in a direction perpendicular to the semiconductor layer, wherein the gate electrode at least extends to a junction of the non-doped part and each of the doped parts.

2. The thin film transistor according to claim 1, wherein within a plane where the semiconductor layer is located, the semiconductor layer comprises a central non-doped portion and at least three protrusions which are adjacent to and connected with the central non-doped portion, and a concave is formed between the protrusions which are adjacent to each other and provided with extension directions intersecting with each other;
each of the protrusions comprises one of the doped parts; and
the non-doped part comprises the central non-doped portion.

3. The thin film transistor according to claim 2, wherein each of the protrusions further comprises an edge non-doped portion close to the central non-doped portion; and
the non-doped part further comprises the edge non-doped portion.

4. The thin film transistor according to claim 3, wherein in a direction from each protrusion to the central non-doped portion, a ratio of a dimension of the edge non-doped portion in the protrusion to a dimension of the non-doped part, is less than or equal to one seventh.

5. The thin film transistor according to claim 3, wherein in a direction from each protrusion to the central non-doped portion, a dimension of the edge non-doped portion in the protrusion is greater than 0 μm and less than 1 μm.

6. The thin film transistor according to claim 2, wherein edges of adjacent protrusions, close to each other, intersect with each other.

7. The thin film transistor according to claim 2, wherein the at least three protrusions at least comprise two protrusions which are respectively disposed on two opposite sides of the non-doped part and have opposite protruding directions.

8. The thin film transistor according to claim 7, wherein the at least three protrusions comprise an even number of protrusions.

9. The thin film transistor according to claim 2, wherein a planar shape of the semiconductor layer is T-shaped, cross-shaped or X-shaped.

10. The thin film transistor according to claim 1, further comprising:
a shielding layer covering the semiconductor layer, wherein the shielding layer overlaps the non-doped part and does not overlap the doped parts in the direction perpendicular to the semiconductor layer.

11. The thin film transistor according to claim 1, wherein a material of the semiconductor layer comprises polycrystalline silicon or monocrystalline silicon.

12. A method for testing the thin film transistor according to claim 1, wherein
the at least three doped parts comprises a first doped part, a second doped part and a third doped part; the first doped part and the third doped part are disposed on two opposite sides of the non-doped part; the second doped part is disposed between the first doped part and the third doped part in a direction from the first doped part to the third doped part;
the at least three source/drain electrodes are respectively electrically connected with the at least three doped parts; and
the method comprises:

applying a first signal to the gate electrode of the thin film transistor, and acquiring a first test result by utilization of two source/drain electrodes which are respectively electrically connected with the first doped part and the third doped part; and applying a second signal to the gate electrode of the thin film transistor, and acquiring a second test result by utilization of two source/drain electrodes which are respectively electrically connected with two doped parts in the at least three doped parts, except the first doped part.

13. The method according to claim 12, wherein the at least three source/drain electrodes comprise a source electrode, a first drain electrode and a second drain electrode; the source electrode is electrically connected with the third doped part; the first drain electrode is electrically connected with the first doped part; the second drain electrode is electrically connected with the second doped part; and in the method, the second test result is acquired by utilization of the source electrode and the second drain electrode; or the at least three source/drain electrodes comprise a drain electrode, a first source electrode and a second source electrode; the drain electrode is electrically connected with the third doped part; the first source electrode is electrically connected with the first doped part; the second source electrode is electrically connected with the second doped part; and in the method, the second test result is acquired by utilization of the drain electrode and the second source electrode.

14. The method according to claim 12, wherein the at least three doped parts further comprise a fourth doped part; the second doped part and the fourth doped part are disposed between the first doped part and the third doped part in the direction from the first doped part to the third doped part and disposed on other two opposite sides of the non-doped part;

the at least three source/drain electrodes comprise a first source electrode, a first drain electrode, a second source electrode and a second drain electrode; the first source electrode and the first drain electrode are respectively electrically connected with the first doped part and the third doped part; the second source electrode and the second drain electrode are respectively electrically connected with the second doped part and the fourth doped part; and in the method, the second test result is acquired by utilization of the second source electrode and the second drain electrode.

15. The method according to claim 12, wherein each of the first signal and the second signal comprises a voltage signal; and each of the first test result and the second test result comprises a current value.

16. An array substrate, comprising a display region and a non-display region disposed at a periphery of the display region, wherein a test area is disposed in the non-display region and provided with at least one thin film transistor according to claim 1.

17. The array substrate according to claim 16, wherein the display region is provided with a plurality of display-region thin film transistors (TFTs) arranged in a matrix; and the display-region TFTs and the thin film transistor in the test area have a same layer structure.

18. A display device, comprising the array substrate according to claim 16.

19. A method for manufacturing a thin film transistor, comprising:

forming a semiconductor layer, wherein the semiconductor layer comprises at least three doped parts and a non-doped part which is continuously formed and which is connected with each of the at least three doped parts; and the at least three doped parts are spaced from each other and distributed at a periphery of the non-doped part;

forming at least three source/drain electrodes, wherein the at least three source/drain electrodes are respectively electrically connected with the at least three doped parts and spaced from each other; and forming a gate electrode, wherein the gate electrode overlaps the non-doped part in a direction perpendicular to the semiconductor layer and at least extends to a junction of the non-doped part and each of the doped parts.

20. The method according to claim 19, wherein forming a semiconductor film, forming a semiconductor layer pattern by patterning the semiconductor film, forming the gate electrode on the semiconductor layer pattern, and forming the doped parts by performing an ion implantation on a part, not shielded by the gate electrode, of the semiconductor layer pattern, to form the semiconductor layer; or forming a semiconductor film, forming a semiconductor layer pattern by patterning the semiconductor film, forming a shielding layer on the semiconductor layer pattern, and forming the doped parts by performing an ion implantation on a part, not shielded by the shielding layer, of the semiconductor layer pattern, to form the semiconductor layer.

* * * * *